(12) United States Patent
Du et al.

(10) Patent No.: US 12,230,653 B2
(45) Date of Patent: Feb. 18, 2025

(54) UTTB PHOTODETECTOR PIXEL UNIT, ARRAY AND METHOD

(71) Applicant: PEKING UNIVERSITY, Beijing (CN)

(72) Inventors: Gang Du, Beijing (CN); Liqiao Liu, Beijing (CN); Xiaoyan Liu, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 522 days.

(21) Appl. No.: 17/442,806

(22) PCT Filed: Jul. 24, 2020

(86) PCT No.: PCT/CN2020/104518
§ 371 (c)(1),
(2) Date: Sep. 24, 2021

(87) PCT Pub. No.: WO2021/093370
PCT Pub. Date: May 20, 2021

(65) Prior Publication Data
US 2022/0254822 A1     Aug. 11, 2022

(30) Foreign Application Priority Data
Nov. 13, 2019  (CN) .......................... 201911108333.5

(51) Int. Cl.
*H01L 27/14* (2006.01)
*H01L 27/146* (2006.01)

(52) U.S. Cl.
CPC .. *H01L 27/14614* (2013.01); *H01L 27/14632* (2013.01); *H01L 27/14643* (2013.01)

(58) Field of Classification Search
CPC ......... H01L 27/14614; H01L 27/14632; H01L 27/14643; H01L 27/14603;
(Continued)

(56) References Cited

U.S. PATENT DOCUMENTS 5,859,462 A    1/1999  Tredwell et al.
7,745,860 B2 *  6/2010  Inoue ................ H01L 27/14641
                                                        257/292
(Continued)

FOREIGN PATENT DOCUMENTS

CN    103378114 B    4/2016
CN    108493202 A    9/2018
(Continued)

OTHER PUBLICATIONS

International Search Report dated Oct. 28, 2020 issued in PCT/CN2020/104518.
(Continued)

*Primary Examiner* — Shouxiang Hu
(74) *Attorney, Agent, or Firm* — Scully, Scott, Murphy & Presser, P.C.

(57) ABSTRACT

The present application discloses a UTBB photodetector pixel unit, array and method, including: a silicon film layer, a buried oxide layer, a charge collection layer and a substrate, the silicon film layer, the buried oxide layer, the charge collection layer and the substrate being arranged in sequence from top to bottom; the silicon film layer includes NMOS transistors or PMOS transistors; the charge collection layer includes charge collection control regions and charge accumulation regions; and the substrate includes an N-type substrate or a P-type substrate. A centripetal electric field is formed around the charge accumulation regions, and photo-generated charges are accumulated in the corresponding pixel units under the action of the centripetal electric field. The existence of the centripetal electric field improves the photoelectric conversion efficiency, suppresses the crosstalk between pixels, saves the area of shallow trench isolation, reduces the size, and makes it more suitable for sub-micron pixels.

5 Claims, 3 Drawing Sheets

(58) Field of Classification Search
CPC ......... H01L 27/14601; H01L 27/14687; H01L 27/14612
See application file for complete search history.

(56) References Cited

U.S. PATENT DOCUMENTS

| | | | |
|---|---|---|---|
| 9,978,848 B2 | 5/2018 | Ito | |
| 2005/0230720 A1* | 10/2005 | Miyagawa | H01L 27/14603 257/292 |
| 2008/0001192 A1* | 1/2008 | Inoue | H01L 27/14641 348/E3.018 |
| 2013/0168823 A1 | 7/2013 | Iijima | |
| 2015/0338720 A1* | 11/2015 | Grenouillet | H01L 27/092 359/108 |
| 2019/0074398 A1 | 3/2019 | Kadura et al. | |

FOREIGN PATENT DOCUMENTS

| | | |
|---|---|---|
| CN | 108666336 A | 10/2018 |
| CN | 109728019 A | 5/2019 |
| CN | 111063702 A | 4/2020 |
| JP | H04879 A | 1/1992 |
| JP | 2009147056 A | 7/2009 |

OTHER PUBLICATIONS

First Office Action dated Nov. 30, 2021 received in Chinese Patent Application No. CN 201911108333.5.
Notice of Reasons for Refusal dated Nov. 1, 2022 received in Japanese Patent Application No. JP 2021-562050.
Written Decision on Registration dated Dec. 4, 2023 received in Korean Patent Application No. KR 10-2021-7029060.

* cited by examiner

UTTB PHOTODETECTOR PIXEL UNIT, ARRAY AND METHOD

TECHNICAL FIELD

The present application relates to the field of silicon-based photodetectors, and in particular to a UTBB photodetector pixel unit, array and method.

BACKGROUND

Photoelectric imaging detectors are widely used in military, medical, automotive, mobile devices, etc. Current mainstream photoelectric imaging detectors are CCD (charge-coupled device) photoelectric devices and CMOS-APS photoelectric devices. CCD photoelectric devices carry out photodetection directly through charge transfer, while in CMOS-APS photoelectric devices, charges are collected through pixel unit photodiodes and then converted into voltage signals that are amplified and read by CMOS circuits. The two photodetector devices have their own advantages and disadvantages. However, due to structural limitations of the devices themselves, a single pixel unit of the two photodetectors each includes device structures such as multiple transistors, so that the pixel size is limited to the order of micrometers and cannot be further reduced. By using a single transistor, such as an ultra-thin box and body (UTBB) structure, the pixel unit size of the photodetection unit can be effectively reduced. However, in current solutions that use the UTBB structure as an image sensor, shallow trench isolation is required to suppress the crosstalk between pixels, which limits the further reduction of the pixel unit.

In summary, there is a need to provide a photodetector pixel unit, array, and method, which have a small size and can suppress crosstalk.

SUMMARY

In order to solve the above problems, the present application proposes a UTBB photodetector pixel unit, array and method.

In an aspect, the present application proposes a UTBB photodetector pixel unit, which includes: a silicon film layer, a buried oxide layer, a charge collection layer and a substrate, the silicon film layer, the buried oxide layer, the charge collection layer and the substrate being arranged in sequence from top to bottom;

the silicon film layer includes NMOS transistors or PMOS transistors;

the charge collection layer is configured to form a centripetal electric field to collect photo-generated charges, and includes charge collection control regions and charge accumulation regions; and the substrate includes: an N-type substrate or a P-type substrate.

Preferably, a source terminal and a drain terminal of the NMOS transistor are respectively located on both sides of a channel of the NMOS transistor, and a gate terminal of the NMOS transistor is on the channel of the NMOS transistor; and a source terminal and a drain terminal of the PMOS transistor are respectively located on both sides of a channel of the PMOS transistor, and a gate terminal of the PMOS transistor is on the channel of the PMOS transistor.

In a second aspect, the present application proposes a UTBB photodetector array, which includes: a plurality of the photodetector pixel units, the plurality of photodetector pixel units forming a photodetector array, wherein both the number of rows and the number of columns of the photodetector array are natural numbers larger than or equal to 2.

Preferably, the NMOS transistors or PMOS transistors of the adjacent photodetector pixel units use the same one source terminal or drain terminal.

Preferably, the photodetector array includes multiple columns of word lines, multiple rows of bit lines, a common-region electrode, and a common source, wherein the source terminals of all the NMOS transistors or the source terminals of the PMOS transistors are connected with the common source, all the charge collection control regions of the charge collection layer are connected with the common-region electrode, the gate terminals of each column of photodetectors are connected with their corresponding word lines, and the drains of each row of photodetectors are connected with their corresponding bit lines.

In a third aspect, the present application proposes a detection method for a UTBB photodetector pixel unit, which includes:

applying a corresponding voltage to charge collection control regions, generating a centripetal electric field around charge accumulation regions, and producing photo-generated carriers in a charge collection layer and a substrate by incident light, wherein the photo-generated carriers enter the charge accumulation regions under the action of the centripetal electric field and are accumulated under a buried oxide layer;

applying a positive voltage to gate terminals and drain terminals of a silicon film layer, and applying a corresponding voltage to the charge collection control regions;

the photo-generated carriers accumulated in the charge accumulation regions changing according to a light intensity, so that a threshold voltage and a drain current of the NMOS transistor or PMOS transistor both change;

measuring the drain current of the silicon film layer above the buried oxide layer; and evaluating the light intensity.

The present application has the following advantages: by forming the centripetal electric field around the charge accumulation region, the photo-generated charges are accumulated in the corresponding pixel unit under the action of the centripetal electric field. The existence of the centripetal electric field improves the photoelectric conversion efficiency, suppresses the crosstalk between pixels, saves the area of shallow trench isolation, reduces the size, and makes it more suitable for sub-micron pixels.

BRIEF DESCRIPTION OF THE DRAWINGS

Upon reading a detailed description of preferred embodiments below, various other advantages and benefits will become clear to those skilled in the art. The drawings are only used for the purpose of illustrating preferred implementations, and should not be considered as a limitation to the present application. Moreover, throughout the drawings, identical components are denoted by identical reference signs. In the drawings.

Figure 1:
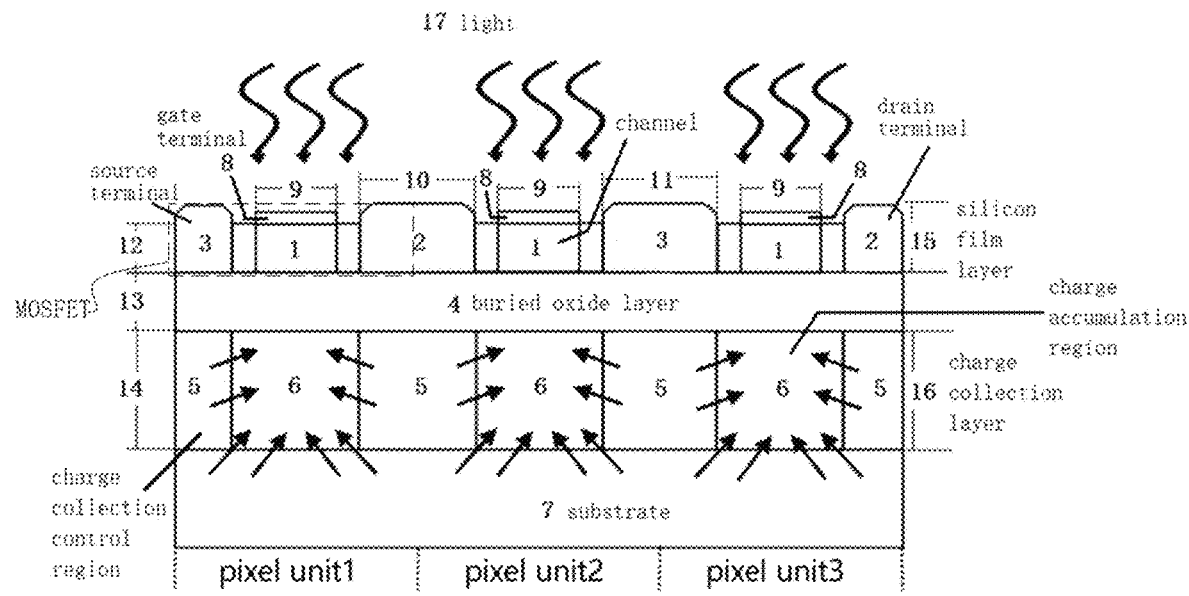
FIG. 1 is a structural view of a UTBB photodetector pixel unit provided by the present application.

| Description of Reference Signs | |
|---|---|
| 1 channel | 2 drain terminal |
| 3 source terminal | 4 buried oxide layer |
| 5 charge collection control region | 6 charge accumulation region |
| 7 substrate | 8 gate terminal |
| 9 length of channel | 10 length of drain terminal |
| 11 length of source terminal | 12 thickness of silicon film |
| 13 thickness of buried oxide layer | 14 depth of charge collection layer |
| 15 silicon film layer | |
| 17 light | 16 charge collection layer |

DETAILED DESCRIPTION

Hereinafter, exemplary embodiments of the present disclosure will be described in more detail with reference to the accompanying drawings. Although the exemplary embodiments of the present disclosure are shown in the drawings, it should be understood that the present disclosure may be implemented in various forms and should not be limited by the embodiments set forth herein. On the contrary, these embodiments are provided to enable a more thorough understanding of the present disclosure and to fully convey the scope of the present disclosure to those skilled in the art.

According to an embodiment of the present application, a UTBB photodetector pixel unit is proposed, which, as shown in FIG. 1, includes: a silicon film layer 15, a buried oxide layer 4, a charge collection layer 16 and a substrate 7, the silicon film layer 15, the buried oxide layer 4, the charge collection layer 16 and the substrate 7 being arranged in sequence from top to bottom;

the silicon film layer 15 includes NMOS transistors or PMOS transistors;

the charge collection layer 16 includes charge collection control regions 5 and charge accumulation regions 6 arranged alternately; and the substrate 7 includes: an N-type substrate or a P-type substrate.

a source terminal 3 and a drain terminal 2 of the NMOS transistor are respectively located on both sides of a channel 1 of the NMOS transistor, and a gate terminal 8 of the NMOS transistor is on the channel 1 of the NMOS transistor; and a source terminal 3 and a drain terminal 2 of the PMOS transistor are respectively located on both sides of a channel 1 of the PMOS transistor, and a gate terminal 8 of the PMOS transistor is on the channel 1 of the PMOS transistor.

For the NMOS transistor and PMOS transistor, a length of the channel 1 thereof is 20 to 100 nanometers, a length of the source terminal 11 thereof is 20 to 90 nanometers, and a length of the drain terminal 10 thereof is 20 to 90 nanometers.

A thickness of the silicon film 12 of the silicon film layer 15 is 5 to 20 nanometers.

A thickness of the buried oxide layer 13 is 10 to 30 nanometers.

A depth of the charge collection layer 14 is 50 to 1000 nanometers.

The charge collection layer 16 includes at least one charge accumulation region 6. That is, each pixel unit must include a charge accumulation region 6 for generating a centripetal electric field and accumulating photo-generated charges.

The transistors in the silicon film layer 15 may be all NMOS transistors or all PMOS transistors, and the use of either NMOS transistors or PMOS transistors does not affect the arrangement of other layers (such as the alternately arranged charge collection control regions and charge accumulation regions of the charge collection layer) and the substrate 7 (N-type substrate or P-type substrate).

The relative position of the charge accumulation regions 6, the charge collection control regions 5 and the MOSFETs of the silicon film layer 15 in the horizontal direction may be adjusted.

The structure of the charge collection layer 16 is not limited to the alternate arrangement of P-type wells and N-type wells.

A doping concentration and area of the P-type well and the N-type well may be adjusted separately.

As shown in FIG. 1, in an example in which NMOS transistors are used in the silicon film layer 15, the charge collection control regions 5 are N-type wells, the charge accumulation regions 6 are P-type wells, and the substrate 7 is an N-type substrate, each pixel unit must include one charge accumulation region 6, which may or may not be located in the center of the pixel unit.

In another embodiment of the present application, the charge collection control regions 5 in the charge collection layer 16 may also be P-type wells, and at the same time, the charge accumulation regions 6 are N-type wells.

The charge collection control regions 5 and the charge accumulation regions 6 in the charge collection layer 16 may also include substances used to form other structures such as heterojunctions.

A PN junction consists of one N-type well and one P-type well that are in close contact.

As shown in FIG. 1, a horizontal PN junction is formed between the P-type well and the N-type well, and a vertical PN junction is formed between the P-type well and the N-type substrate 7. The two together form a centripetal electric field as shown by arrows in FIG. 1. Light 17 is incident into the photodetector from above the device, and produces photo-generated charges in the wells and the substrate 7. The photo-generated charges are accumulated in the corresponding pixel units under the action of the centripetal electric field.

The P-type wells and the N-type wells may be exchanged, that is, a corresponding voltage is applied to the P-type wells, and the N-type wells are configured to collect the photo-generated charges. As shown in FIG. 1, in order to generate the centripetal electric field by the P-type wells, in this case, an N-type substrate 7 is used and a voltage is applied to the N-type wells. If it is desired to generate the centripetal electric field by the N-type wells, a voltage is required to be applied to the P-type wells, and the substrate needs 7 to use a P-type substrate Z.

The light 17 can be incident (irradiated) from above and/or below the photodetector pixel unit.

The method of forming the centripetal electric field around the charge accumulation regions 6 includes, but is not limited to: forming alternately arranged N-type wells and P-type wells in the charge collection layer 16 to serve as the charge collection regions 5 and the charge accumulation regions 6, respectively; and forming horizontal PN junctions between the P-type wells and the N-type wells, and vertical PN junctions between the P-type wells and the N-type substrate 7. The electric fields of the horizontal PN junctions and the vertical PN junctions together form the centripetal electric field. The centripetal electric field may also be formed by forming other structures such as heterojunctions.

Figure 2:
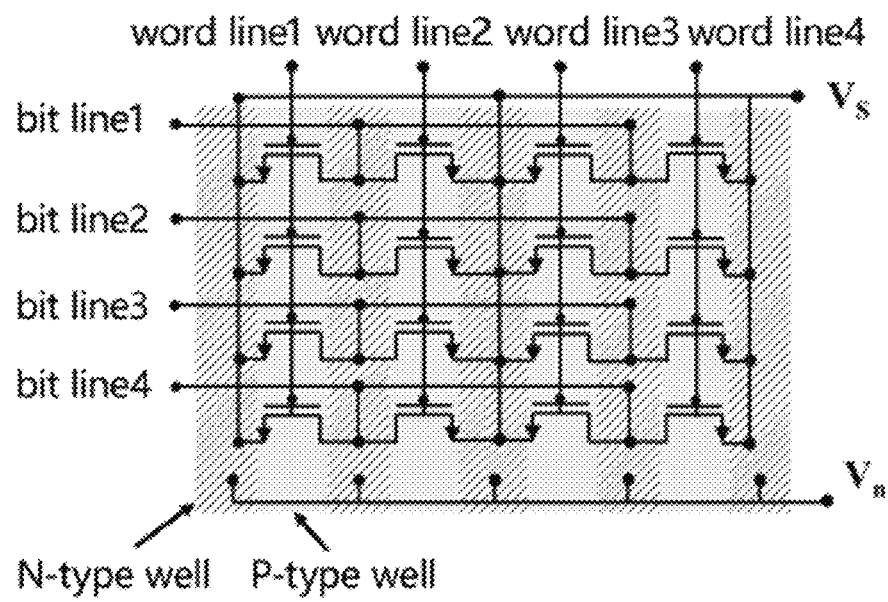
FIG. 2 is a structural view of a UTBB photodetector array provided by the present application.

In a second aspect, the present application proposes a UTBB photodetector array, which, as shown in FIG. 2, includes: a plurality of the photodetector pixel units, the plurality of photodetector pixel units forming a photodetector array, wherein both the number of rows and the number of columns of the photodetector array are natural numbers larger than or equal to 2.

The NMOS transistors or PMOS transistors of the adjacent photodetector pixel units use the same one source terminal 3 or drain terminal 2. FIG. 1 shows three pixel units, and adjacent NMOS transistors or PMOS transistors share the source terminal 3 and the drain terminal 2.

The photodetector array includes multiple columns of word lines, multiple rows of bit lines, a common-region electrode, and a common source, wherein the source terminals of all the NMOS transistors or the source terminals of the PMOS transistors are connected with the common source, all the charge collection control regions of the charge collection layer are connected with the common-region electrode, the gate terminals of each column of photodetectors are connected with their corresponding word lines, and the drains of each row of photodetectors are connected with their corresponding bit lines.

Taking the use of NMOS transistors in the silicon film layer as an example, the embodiment of the present application will be further described.

The source terminals of all the NMOS transistors are connected to the common source Vs and set to 0 potential. All the charge collection control regions (in this example, N-type wells) in the substrate are connected to the common-region electrode (electrode Vn of a common N region). The gate terminals of each column of devices (photodetector pixel units) are commonly connected to the word lines, and the drain terminals of each row of devices are commonly connected to the bit lines. When the devices are reset, all the word lines are set to 0 potential, all the bit lines are set to 0 potential, and the N-type wells are set to a negative potential. When the signal is collected, all the word lines and bit lines maintain at 0 potential, and the N-type wells are set to a positive potential. When the signal is read, all the bit lines are set to +Vdd, and each column of word lines are selected in turn. The potential of the selected word line is set to +Vdd, and the signal current of each NMOS transistor is read through the bit line.

Figure 3:
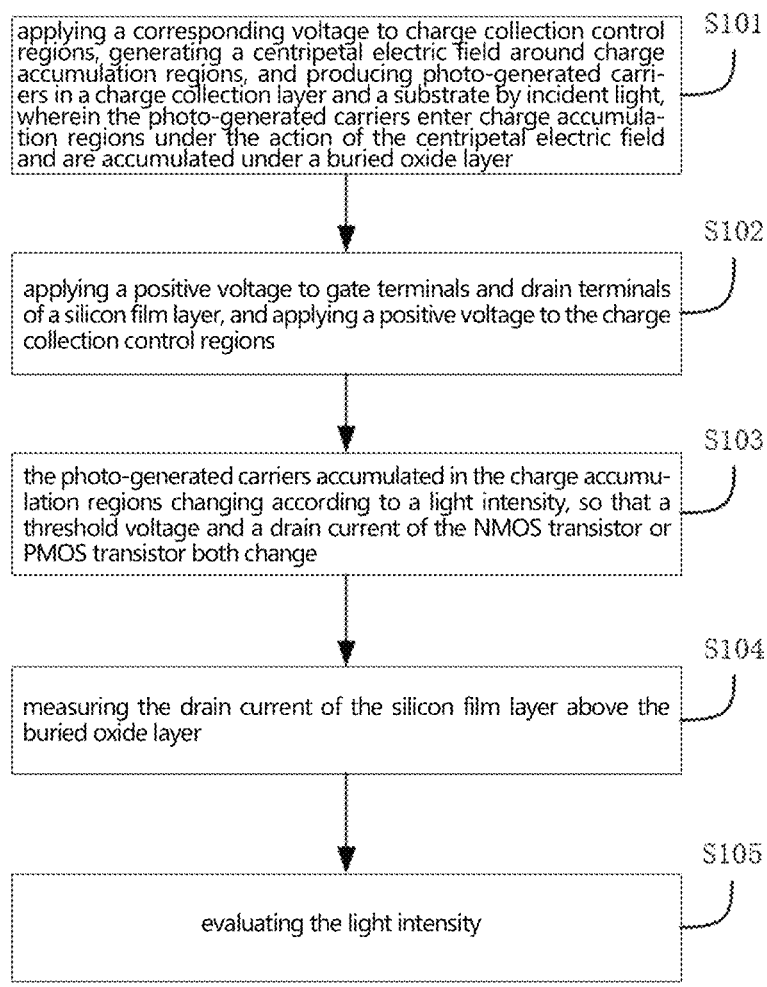
FIG. 3 is a schematic view showing the steps of a detection method for a UTBB photodetector pixel unit provided by the present application.

In a third aspect, the present application proposes a detection method for a UTBB photodetector pixel unit, which, as shown in FIG. 3, includes:

S101: applying a corresponding voltage to charge collection control regions, and producing photo-generated carriers in a charge collection layer and a substrate by incident light, wherein the photo-generated carriers enter charge accumulation regions under the action of a centripetal electric field and are accumulated under a buried oxide layer;

S102: applying a positive voltage to gate terminals and drain terminals of a silicon film layer, and applying a positive voltage to the charge collection control regions;

S103: the photo-generated holes accumulated in the charge accumulation regions changing according to a light intensity, so that a threshold voltage and a drain current of the NMOS transistor or PMOS transistor both change;

S104: measuring the drain current of the silicon film layer above the buried oxide layer; and S105: evaluating (measuring) the light intensity.

The voltage applied to the charge collection control regions is changed according to the specific structure and material as used.

Using an example in which the silicon film layer uses NMOS transistors, the charge collection control regions are N-type wells, the charge accumulation regions are P-type wells, and the substrate is an N-type substrate, the embodiment of the present application will be further described.

A positive voltage is applied to the charge collection control regions of the charge collection layer, the incident light produces photo-generated carriers in the charge collection layer and the substrate, and the photo-generated carriers enter the charge accumulation regions under the action of the centripetal electric field and are accumulated under the buried oxide layer;

a positive voltage is applied to the gate terminals and drain terminals of the silicon film layer, and a positive voltage is applied to the charge collection control regions;

the photo-generated carriers accumulated in the charge accumulation regions change according to the light intensity, so that the threshold voltage and the drain current of the NMOS transistor both change;

the drain current of the silicon film layer above the buried oxide layer is measured; and the light intensity is evaluated.

Using an example in which the silicon film layer uses NMOS transistors, the charge collection control regions are P-type wells, the charge accumulation regions are N-type wells, and the substrate is an N-type substrate, the embodiment of the present application will be further described.

A negative voltage is applied to the charge collection control regions of the charge collection layer, the incident light produces photo-generated carriers in the charge collection layer and the substrate, and the photo-generated carriers enter the charge accumulation regions under the action of the centripetal electric field and are accumulated under the buried oxide layer;

a positive voltage is applied to the gate terminals and drain terminals of the silicon film layer, and a negative voltage is applied to the charge collection control regions;

the photo-generated carriers accumulated in the charge accumulation regions change according to the light intensity, so that the threshold voltage and the drain current of the NMOS transistor both change;

the drain current of the silicon film layer above the buried oxide layer is measured; and the light intensity is evaluated.

Photo-generated holes and photo-generated electrons are produced when semiconductor materials are excited by light, and are collectively referred to as photo-generated carriers. The photo-generated carriers are separated under the action of the self-built electric field of the PN junction.

If a forward voltage is applied to the N-type wells, the photo-generated holes will enter the P-type wells under the action of the centripetal electric field.

The detection method of the embodiment of the present application is mainly divided into three phases of resetting, collecting, and reading. Taking the silicon film layer using NMOS transistors as an example, the corresponding electrode bias conditions are shown in Table 1.

TABLE. 1

|  | Reset | Collect | Read |
| --- | --- | --- | --- |
| Gate voltage of NMOS transistor | 0 | 0 | +Vdd |
| Drain voltage of NMOS transistor | 0 | 0 | +Vdd |
| Source voltage of NMOS transistor | 0 | 0 | 0 |
| N-type well voltage | Vreset | +Vdd | +Vdd |

In the resetting phase, the source voltage, drain voltage and gate voltage of the MOS transistor are zero, making the MOS transistor in an off state. A reset pulse signal Vreset is applied to the N-type well terminal to forward-bias the PN junction, and the forward bias current injects charges into the floating P-type well and resets the P-type well voltage to the initial voltage.

In the collecting phase, the device is exposed to light, the N-type well terminal voltage is set to +Vdd, and the PN junction is reverse-biased. The incident light produces photo-generated carriers in the PN junction below the device, and the photo-generated carriers are separated under the action of the self-built electric field of the PN junction. Under the action of the centripetal electric field, the photo-generated holes enter the P-type wells and are accumulated under the buried oxide layer.

Figure 4:
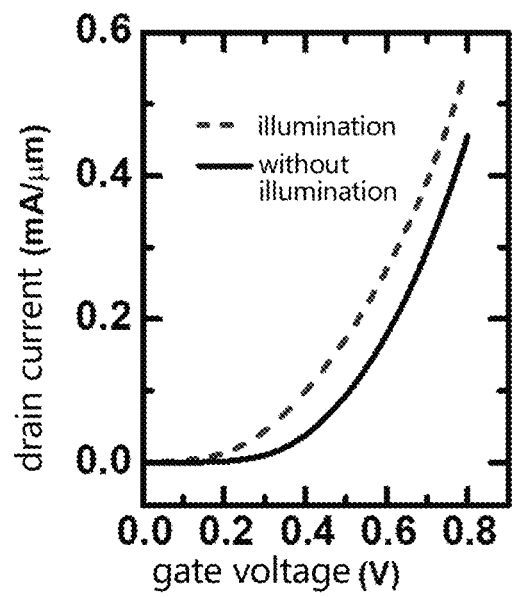
FIG. 4 shows MOS transistor transfer characteristic curves of a detection method for a UTBB photodetector pixel unit provided by the present application before and after illumination.

In the reading phase, the light signal is read out through the drain current of the MOSFET above the buried oxide layer. The gate electrode (gate terminal) and drain electrode (drain terminal) of the NMOS transistor are both set to a positive voltage. The photo-generated holes accumulated under the buried oxide layer raise the potential at the interface between the buried oxide layer and the substrate, and act on the channel of the MOSFET device above through the buried oxide layer. The buried oxide layer forms a structure similar to a capacitor, and makes the inversion carriers in the channel of the NMOS device increase and the threshold voltage decrease. As shown in FIG. 4, under different light intensities, the amount of positive charges accumulated in the substrate under the buried oxide layer is different, so the threshold voltage of the MOSFET device is different, and the drain current is different. The light intensity can be evaluated indirectly by measuring the drain current of the MOSFET above the buried oxide layer.

FIG. 4 shows the transfer characteristic curve of the MOSFET device before and after illumination.

Figure 5:
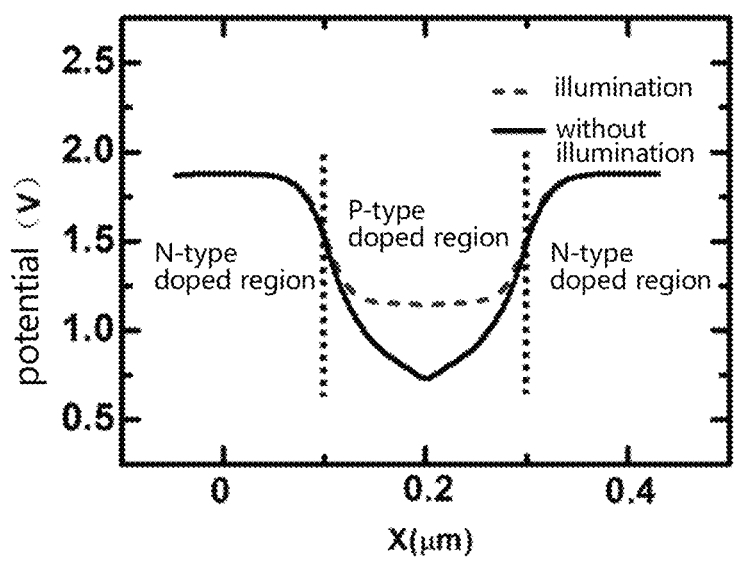
FIG. 5 shows potential distribution at an interface between adjacent P-type well and N-type well and a buried oxide layer of a detection method for a UTBB photodetector pixel unit provided by the present application before and after illumination.

The potential distribution at the interface between the adjacent P-type well and N-type well and the buried oxide layer before and after illumination is shown in FIG. 5.

In the embodiment of the present application, by forming a centripetal electric field around the charge accumulation regions, the photo-generated charges are accumulated in the corresponding pixel units under the action of the centripetal electric field. The charge collection control regions and the charge accumulation regions alternately arranged in the charge collection layer may be N-type wells (N-type doped regions) and P-type wells (P-type doped regions). The substrate includes an N-type substrate or a P-type Substrate. A horizontal PN junction is formed between the P-type well and the N-type well, a vertical PN junction is formed between the P-type well and the N-type substrate, and the two together form a centripetal electric field. The photo-generated charges are accumulated in the corresponding pixel units under the action of the centripetal electric field. The existence of the centripetal electric field improves the photoelectric conversion efficiency, suppresses the crosstalk between pixels, saves the area of shallow trench isolation, reduces the size, and makes it more suitable for sub-micron pixels. The centripetal electric field can make the charges be actively accumulated in the corresponding pixel units; the photo-generated charges accumulated under the buried oxide layer affect the electrical characteristics of the MOSFET through the back gate modulation effect. With the photodetector array structure based on UTBB and centripetal electric field, the array arrangement of the source and drain shared by each row of pixels avoids shallow trench isolation and improves pixel density. Each pixel unit only needs a single device to complete the photosensitive function, which can effectively reduce the size of the pixel unit. A centripetal electric field is used to collect the photo-generated charges, and the horizontal electric field and the vertical electric field work together so that the photo-generated electrons can drift and be accumulated under the buried oxide layer. By collecting the photo-generated charges by the centripetal electric field and by suppressing crosstalk, and with the array arrangement of the shared sources and drains, the area of shallow trench isolation is saved, making it more suitable for sub-micron pixels.

Described above are only specific preferred embodiments of the present application, but the scope of protection of the present application is not limited to this. Any person skilled in the art can easily think of changes or replacements within the technical scope disclosed in the present application, which will all be covered within the scope of protection of the present application. Therefore, the scope of protection of the present application shall be accorded with the scope of the claims.

The invention claimed is:

1. A UTBB photodetector pixel unit, comprising: a silicon film layer, a buried oxide layer, a charge collection layer and a substrate, the silicon film layer, the buried oxide layer, the charge collection layer and the substrate being arranged in sequence from top to bottom;
    wherein the silicon film layer comprises NMOS transistors or PMOS transistors;
    the charge collection layer is configured to form a centripetal electric field to collect photo-generated charges, and comprises charge collection control regions and charge accumulation regions; and
    the substrate comprises: an N-type substrate or a P-type substrate;
    wherein alternately arranged N-type wells and P-type wells are formed in the charge collection layer to serve as the charge collection control regions and the charge accumulation regions, respectively; wherein horizontal PN junctions between the P-type wells and the N-type wells are formed, and vertical PN junctions between the P-type wells and the N-type substrate are formed; and wherein the electric fields of the horizontal PN junctions and the vertical PN junctions together form the centripetal electric field; and
    wherein in order to generate the centripetal electric field by the P-type wells, an N-type substrate is used and a voltage is applied to the N-type wells; if it is desired to generate the centripetal electric field by the N-type wells, a voltage is required to be applied to the P-type wells, and the substrate needs to use a P-type substrate.

2. The photodetector pixel unit according to claim 1, wherein a source terminal and a drain terminal of the NMOS transistor are respectively located on both sides of a channel of the NMOS transistor, and a gate terminal of the NMOS transistor is on the channel of the NMOS transistor; and a source terminal and a drain terminal of the PMOS transistor are respectively located on both sides of a channel of the PMOS transistor, and a gate terminal of the PMOS transistor is on the channel of the PMOS transistor.

3. A UTBB photodetector array, comprising a plurality of the photodetector pixel units according to claim 1, wherein the plurality of photodetector pixel units form a photodetector array, and both the number of rows and the number of columns of the photodetector array are natural numbers larger than or equal to 2.

4. The photodetector array according to claim 3, wherein the NMOS transistors or PMOS transistors of the adjacent photodetector pixel units use the same one source terminal or drain terminal.

5. The photodetector array according to claim 3, wherein the photodetector array comprises multiple columns of word lines, multiple rows of bit lines, a common-region electrode, and a common source, and wherein the source terminals of all the NMOS transistors or the source terminals of the PMOS transistors are connected with the common source, all the charge collection control regions of the charge collection layer are connected with the common-region electrode, the gate terminals of each column of photodetectors are connected with their corresponding word lines, and the drains of each row of photodetectors are connected with their corresponding bit lines.

* * * * *